(12) United States Patent
Zhao et al.

(10) Patent No.: US 12,550,590 B2
(45) Date of Patent: Feb. 10, 2026

(54) DISPLAY PANEL AND MANUFACTURE METHOD THEREOF

(71) Applicants: Chengdu BOE Optoelectronics Technology Co., Ltd., Sichuan (CN); BOE Technology Group Co., Ltd., Beijing (CN)

(72) Inventors: Wuyang Zhao, Beijing (CN); Xiaoliang Guo, Beijing (CN); Liang Song, Beijing (CN); Guodong Liu, Beijing (CN); Zhongfei Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 735 days.

(21) Appl. No.: 17/762,603

(22) PCT Filed: Apr. 8, 2021

(86) PCT No.: PCT/CN2021/085915
§ 371 (c)(1),
(2) Date: Mar. 22, 2022

(87) PCT Pub. No.: WO2021/232983
PCT Pub. Date: Nov. 25, 2021

(65) Prior Publication Data
US 2022/0344619 A1 Oct. 27, 2022

(30) Foreign Application Priority Data
May 21, 2020 (CN) .......................... 202010438710.8

(51) Int. Cl.
*H10K 59/80* (2023.01)
*H10K 59/124* (2023.01)
(Continued)

(52) U.S. Cl.
CPC ......... *H10K 59/873* (2023.02); *H10K 59/124* (2023.02); *H10K 59/1201* (2023.02); *H10K 59/65* (2023.02); *H10K 71/00* (2023.02)

(58) Field of Classification Search
CPC .................................................. H10K 59/124
See application file for complete search history.

(56) References Cited

U.S. PATENT DOCUMENTS

| | | | |
|---|---|---|---|
| 2011/0095342 A1* | 4/2011 | Daniel | .............. H01L 21/02628 257/E21.409 |
| 2017/0133356 A1* | 5/2017 | Mercier | .................. H01L 33/08 |

(Continued)

FOREIGN PATENT DOCUMENTS

| | | |
|---|---|---|
| CN | 108666347 A | 10/2018 |
| CN | 110265583 A | 9/2019 |

(Continued)

OTHER PUBLICATIONS

Office Action dated Aug. 25, 2022, issued in counterpart CN application No. 202010438710.8 with English translation. (24 pages).

*Primary Examiner* — Ajay Ojha
*Assistant Examiner* — Hajar Kolahdouzan
(74) *Attorney, Agent, or Firm* — WHDA, LLP

(57) ABSTRACT

The present disclosure provides a display panel and a manufacture method thereof. The display panel has a through hole penetrating the display panel wherein the display panel further has a water and oxygen insulation structure having: a substrate; a plurality of ring-shaped insulation walls; and a light emitting layer; wherein in a direction outwards from a center of the through hole, at least (Continued)

one side of at least one of the plurality of ring-shaped insulation walls has an undercut, such that the light emitting layer is discontinuous at the undercut, and opposite sides of any two adjacent ones of the plurality of ring-shaped insulation walls do not both have an undercut.

14 Claims, 5 Drawing Sheets

(51) Int. Cl.
*H10K 59/12* (2023.01)
*H10K 59/65* (2023.01)
*H10K 71/00* (2023.01)

(56) References Cited

U.S. PATENT DOCUMENTS

| 2019/0333972 A1* | 10/2019 | Ding | H10K 59/12 |
| 2021/0028249 A1 | 1/2021 | Ding et al. | |
| 2021/0343810 A1* | 11/2021 | You | H10K 59/12 |

FOREIGN PATENT DOCUMENTS

| CN | 110739342 A | 1/2020 |
| CN | 111146366 A | 5/2020 |
| CN | 111180465 A | 5/2020 |
| CN | 111564569 A | 8/2020 |

* cited by examiner

DISPLAY PANEL AND MANUFACTURE METHOD THEREOF

CROSS REFERENCE TO RELATED APPLICATION

The present disclosure is a Section 371 National Stage Application of International Application No. PCT/CN2021/085915, which claims a priority of Chinese Patent Application No. 202010438710.8, filed on May 21, 2020, which is incorporated herein by reference in its entirety.

TECHNICAL FIELD

The present disclosure relates to the technical field of display devices, and particularly to a display panel and a manufacture method thereof.

BACKGROUND

With the development of mobile phones towards full screen display, a solution where a through hole penetrating the display panel is provided to accommodate the front camera of a mobile phone has been proposed. The through hole penetrating the display panel provides a channel to expose the front camera, so as to avoid specifically providing a non-display area for disposing the front camera in an upper or lower frame area of a mobile phone, thereby further meeting the requirements for full screen display.

In this case, because a through hole is formed in the center of the display panel, water, oxygen and the like in the environment may intrude from the inner wall of the through hole, threatening the display area around the through hole of the display panel. In particular, water and oxygen in the environment may migrate towards the interior of the display panel along the light emitting layer of the display panel.

In this regard, it has been proposed to provide an insulation structure in the narrow non-display area surrounding the through hole to interrupt the continuous light emitting layer, thereby blocking further migration of water and oxygen towards the display area. One proposed approach is to form a ring-shaped insulation wall around the through hole before the step of forming the light emitting layer during the manufacture of the display panel, in order to make the light emitting layer discontinuous at the insulation wall in the subsequent step of forming the light emitting layer, thereby reducing the possibility of water and oxygen migrating towards the interior of the display panel along the light emitting layer.

However, there is still a need for developing the water and oxygen insulation structure.

SUMMARY

In an aspect, the present disclosure provides a display panel comprising a through hole penetrating the display panel, a non-display area surrounding the through hole, and a display area surrounding the non-display area, wherein the display panel further comprises a water and oxygen insulation structure located in the non-display area and comprising:

a substrate;
a plurality of ring-shaped insulation walls on the substrate, wherein the plurality of ring-shaped insulation walls are arranged apart outside the through hole from inside out, and each of the ring-shaped insulation walls is surrounding the through hole; and
a light emitting layer, wherein a projection of the light emitting layer on the substrate covers a projection of the ring-shaped insulation walls on the substrate, and the light emitting layer is located on a side of the ring-shaped insulation walls away from the substrate;
wherein in a direction outwards from a center of the through hole, at least one side of at least one of the plurality of ring-shaped insulation walls has an undercut, such that the light emitting layer is discontinuous at the undercut, and opposite sides of any two adjacent ones of the plurality of ring-shaped insulation walls do not both have an undercut.

Preferably, each of the ring-shaped insulation walls has an inner side with an undercut and an outer side without an undercut, or
each of the ring-shaped insulation walls has an outer side with an undercut and an inner side without an undercut.

Preferably, the plurality of ring-shaped insulation walls are alternately an insulation wall with undercuts on both inner side and outer side and an insulation wall without undercut on either inner side or outer side.

Preferably, the display panel further comprises an array of thin film transistors in the display area, and the ring-shaped insulation walls are disposed in the same layer and have the same material as a source/drain electrode of the thin film transistor in the display area.

Preferably, the undercut is a step-shaped undercut.

Preferably, the ring-shaped insulation walls comprise a second sub-layer and a first sub-layer on the second sub-layer, and an orthographic projection of the second sub-layer on the substrate is within an orthographic projection of the first sub-layer on the substrate.

Preferably, the second sub-layer is an aluminum layer, and the first sub-layer is a titanium layer.

Preferably, the undercut has a lateral step in a range from about 0.2 μm to 0.8 μm.

Preferably, the plurality of ring-shaped insulation walls are a plurality of concentric circular ring-shaped insulation walls.

Preferably, the ring-shaped insulation walls have a height in a range from about 0.3 μm to 0.7 μm.

Preferably, a distance between adjacent ring-shaped insulation walls is in a range from about 3 μm to 7 μm.

In another aspect, the present disclosure provides a method for manufacturing the display panel described above, comprising steps of:

forming the plurality of ring-shaped insulation walls on the substrate;
forming a planarization adhesive film layer in the display area and the non-display area after forming the plurality of ring-shaped insulation walls;
removing the planarization adhesive film layer in the non-display area; and
forming the light emitting layer after removing the planarization adhesive film layer in the non-display area.

Preferably, the planarization adhesive film layer is a polyimide layer.

Preferably, the step of forming the plurality of ring-shaped insulation walls comprises forming the plurality of ring-shaped insulation walls in the same layer as a source/drain electrode of a thin film transistor of the display panel.

DETAILED DESCRIPTION OF EMBODIMENTS

It has been proposed to provide an insulation structure in the non-display area surrounding the through hole to interrupt the continuous light emitting layer, thereby blocking migration of water and oxygen. A simple manufacture process without adding equipment investment is to form a ring-shaped insulation wall surrounding the through hole with an electrode material before the step of forming the light emitting layer during the manufacture of the display panel. In the subsequent step of forming the light emitting layer, because the light emitting layer is discontinuous at the insulation wall, the possibility of water and oxygen migrating towards the interior of the display panel along the light emitting layer is reduced.

Figure 1A:
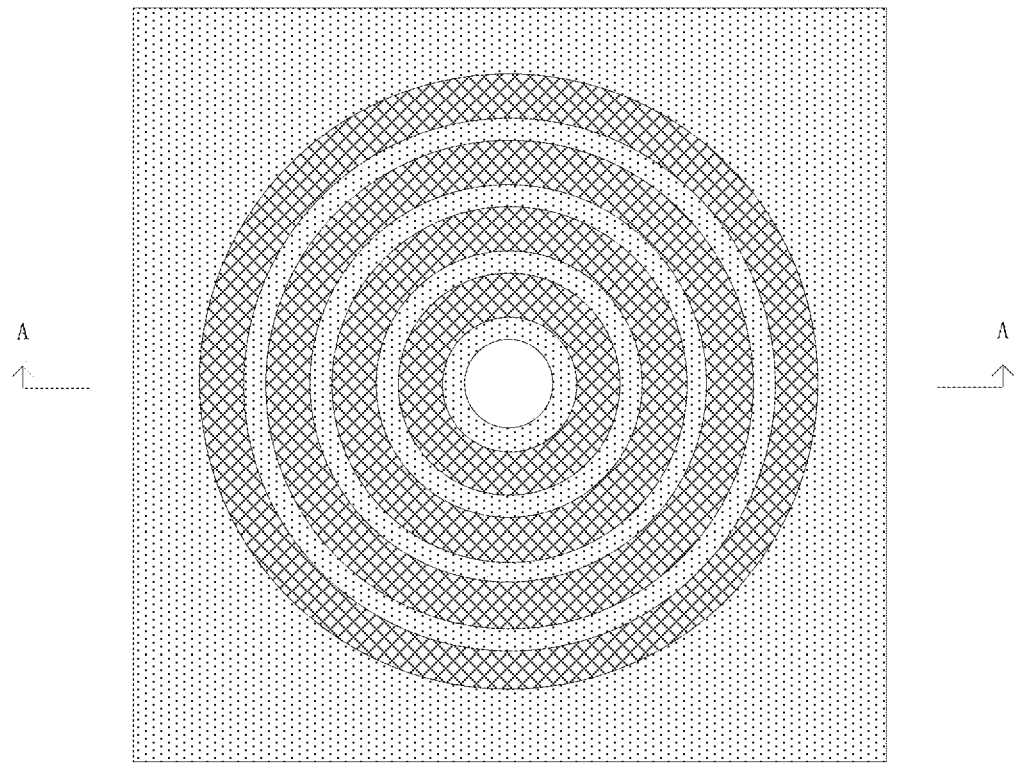
FIGS. 1(a)-1(b) schematically show a through hole penetrating a display panel and a water and oxygen insulation structure around the through hole.
Figure 1B:
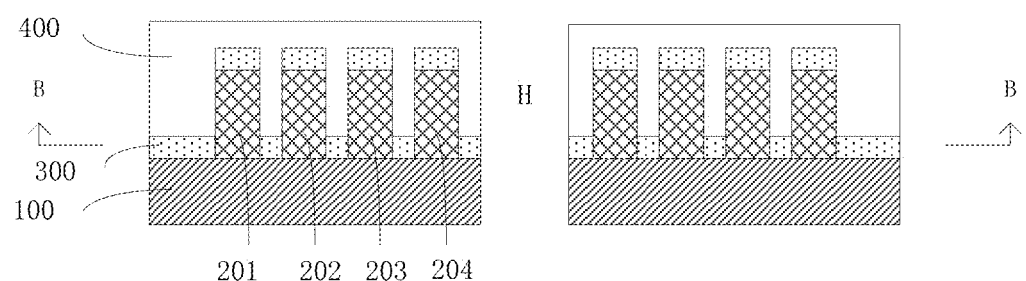

FIGS. 1(a)-1(b) schematically show a through hole penetrating a display panel and a water and oxygen insulation structure around the through hole. Those figures show a through hole penetrating a display panel and a non-display area surrounding the through hole, wherein the non-display area comprises a water and oxygen insulation structure. Those figures show the situation after forming the light emitting layer. The film layers formed after forming light emitting layer are simply depicted as 400. FIG. 1(b) is a sectional view taken along A-A plane in FIG. 1(a), wherein the vertical direction is the thickness direction of the display panel. There is a through hole H in the center of the display panel, which finally penetrates all film layers of the display panel, and may be used, for example, to accommodate the front camera of the mobile phone. In the non-display area around the through hole H, insulation walls 201, 202, 203 and 204 are provided on the substrate 100. The light emitting layer is formed after the insulation walls have been formed. Therefore, the light emitting layer 300 is present on the top of the insulation walls, i.e. on the surfaces of the insulation walls away from the substrate, and on the top of the substrate between the insulation walls.

FIG. 1(a) is a top view taken along the B-B plane in FIG. 1(b). As can be seen, the insulation walls 201-204 are actually ring-shaped insulation walls surrounding the through hole H. In some embodiments, the insulation walls may be arranged continuously or discontinuously.

The light emitting layer in the non-display area is disposed in the same layer as the light emitting layer in the display area. In order to avoid the reduction in the area of display caused by the through hole as much as possible, to avoid the boundary issues caused by merely accurate laying of the light emitting layer within the display area, and also to reduce the process difficulty, the light emitting layer is laid not only in the display area, but also in the non-display area around the through hole till the edge of the through hole. That is, the light emitting layer is formed on the entire surface except outside of the frame area of the display panel. Nevertheless, in the non-display area, the light emitting layer does not emit light.

In the absence of the insulation walls 201-204, the light emitting layer will be continuous. In this case, water and oxygen in the environment may migrate towards the display area along the light emitting layer. Nevertheless, because the insulation walls 201-204 are provided, the light emitting layer may be interrupted at the portion having a height difference, thereby discontinuing the water and oxygen migration path and preventing water and oxygen from intruding into the display area.

It can be understood that the number of the ring-shaped insulation walls may also be less than or more than 4. Further, the ring-shaped insulation walls are not necessarily to be circular ring-shaped, and may be any closed-ring-shaped, such as rectangle ring-shaped, square ring-shaped and ellipse ring-shaped.

Figure 2:
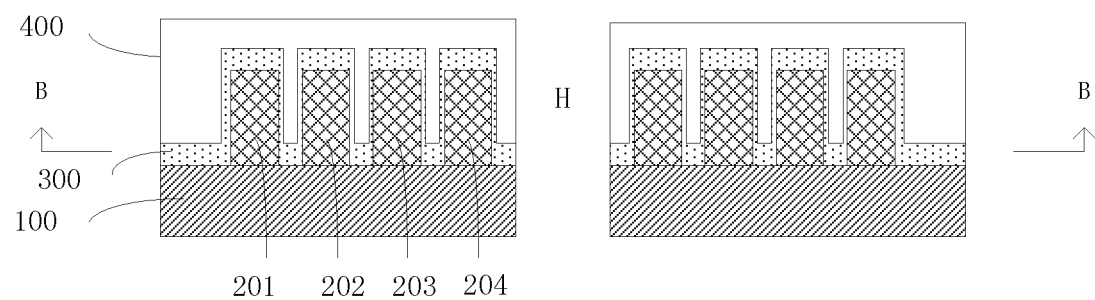
FIG. 2 schematically shows a continuous water and oxygen intrusion passage along the light emitting layer.

However, in practical use, the embodiment as schematically shown in FIGS. 1(a)-1(b) has drawbacks. In particular, as shown in FIG. 2, where the side walls of the insulation walls 201-024 are vertical, vertical side walls tend to cause the following problem: when the light emitting layer is formed after forming the insulation wall, because the material of the light emitting layer generally adheres on the side wall of the insulation wall, the light emitting layer on the top of the insulation wall may be connected together with the light emitting layer on the substrate (i.e., the light emitting layer near the bottom of the insulation wall), so that it cannot be ensured that the light emitting layer is discontinued. In a direction outwards from the center of the through hole, a continuous water and oxygen transport passage is formed.

Figure 3:
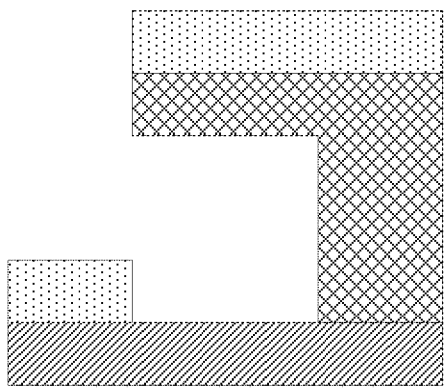
FIGS. 3(a)-3(b) schematically show schematic diagrams of insulation structures having an undercut.
Figure 3:
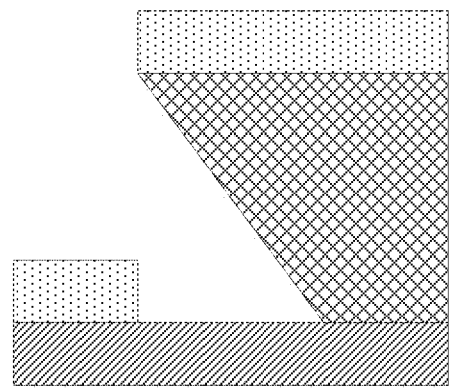

In this regard, an insulation wall having an undercut is proposed. The phrase "having an undercut" means that the top portion of the insulation wall protrude outwards with respect to the bottom thereof. FIGS. 3(a) and (b) schematically show schematic diagrams of insulation structures having an undercut. FIG. 3(a) shows an inverse step-shaped undercut structure, and FIG. 3(b) shows an inverse slope-shaped undercut structure. In the presence of the undercut structure, when the light emitting layer is formed after forming the insulation wall, the problem that the light emitting layer is continuous at the side wall of the insulation wall will not arise, thereby ensuring that the light emitting layer is discontinued.

Figure 4:
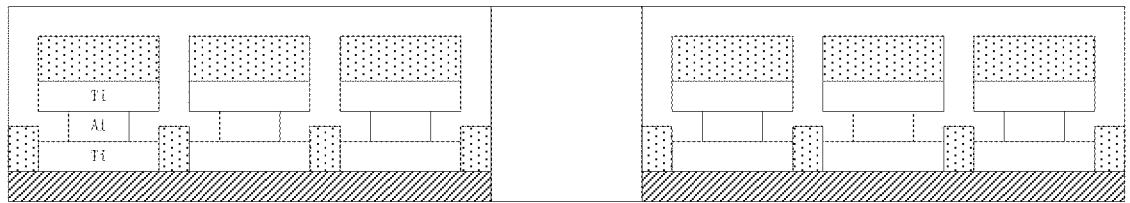
FIG. 4 shows a plurality of Ti—Al—Ti type insulation walls having an inverse step-shaped undercut structure.

FIG. 4 schematically shows a plurality of insulation walls having an inverse step-shaped undercut structure and the light emitting layer thereon. The inventors have found that although the structures having an undercut on both side walls of the insulation wall as shown in FIG. 4 may solve the problem of the water and oxygen intrusion due to continuous light emitting layer, they will cause the problem of "hole halo" around the through hole.

In the manufacture of the display panel, before forming the light emitting layer (typically, after forming the TFT), a planarization layer may be provided. The planarization layer may also be referred to as a planarization adhesive film layer, and will be laid on the entire surface of the display panel. The adhesive film may be, for example, a polyimide (PI) adhesive film. In this process, the planarization layer will also cover the non-display area provided with the ring-shaped insulation walls around the through hole, thereby being laid on the top of and between the ring-shaped insulation walls. Thereafter, the adhesive film in the non-display area is removed, while the adhesive film in the display area is retained, and then a pixel manufacture process is carried out, which comprises forming the light emitting layer on the entire surface as described above.

Figure 5:
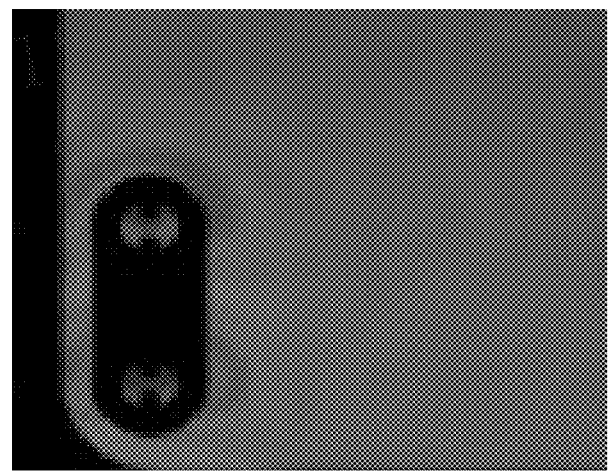
FIG. 5 shows a photograph of a through hole with a hole halo defect.

The inventors have found that after applying the adhesive, the ring-shaped insulation wall regions of the structures as shown in FIG. 4 may result in defects in the peripheral planarization adhesive film layer. In the present disclosure, this phenomena is called "hole halo". The term "hole halo" refers to the phenomena of non-planar film layer occurred in the display area around the through hole. FIG. 5 shows a photograph of a through hole with a hole halo defect. The hole halo significantly affects the appearance of a mobile phone.

Without being bounded by any theory, the inventors have found that the hole halo phenomena may be attributed to the structure where two undercuts are formed on both side walls of each insulation wall in the non-display area around the through hole. Although such a structure may ensure that the light emitting layer is interrupted multiple times, the hole halo problem occurs during subsequent application of the adhesive. Because the opposite sides of adjacent insulation walls both have an undercut, it is easy to form bubbles, which are not easy to be discharged immediately, in the undercuts between the adjacent insulation walls in the adhesive application. Such bubbles remain in the undercuts when applying the adhesive film, and then escape from the adhesive film gradually, so that the adhesive film may collapse into the undercut. Further, when the opposite sides of the adjacent insulation walls both have undercuts, the filling property of the adhesive film between the insulation walls may also be affected, and the adhesive film may be broken. These factors result in non-uniform adhesive film in the non-display area. The non-uniform adhesive film in the non-display area will affect the adhesive film in the display area abutting the non-display area. For example, the adhesive film in the adjacent display area may flow to the collapse site or broken site of the adhesive film in the non-display area. As a result, the thickness of the adhesive film in the display area also becomes non-uniform and non-planar, and in a severe case, even defects such as crack and perforation may be caused. In the final display panel, the adhesive film in the non-display area will be removed, but the effect on the adhesive film in the display area adjacent to the non-display area will remain. The non-uniform planarization adhesive film in the display area results in the hole halo phenomena.

In addition to the hole halo phenomena due to the presence of non-uniform planarization adhesive film in the display area, the above structures also affect other film coating processes performed after forming the insulation walls. For example, after forming the insulation walls, subsequent patterning process typically comprises a step of applying a photoresist on the entire surface. The photoresist coating layer will also be affected by the opposite undercuts of the above adjacent insulation walls. For example, the photoresist coating layer in the display area near the non-display area around the through hole will also have defects such as non-planar surface, or even crack and perforation. Although all the photoresist layer is removed after the patterning process, and will not remain in the final display panel to result in a visual defect of hole halo, the above defects may still lead to defects of the patterned part during the patterning process.

The present disclosure provides an insulation structure which contributes to solving the above problem.

In an embodiment, the present disclosure provides a display panel comprising a through hole penetrating the display panel, a non-display area surrounding the through hole, and a display area surrounding the non-display area, wherein the display panel further comprises a water and oxygen insulation structure located in the non-display area and comprising:

a substrate;

a plurality of ring-shaped insulation walls on the substrate, wherein the plurality of ring-shaped insulation walls are arranged apart outside the through hole from inside out, and each of the ring-shaped insulation walls is surrounding the through hole; and a light emitting layer, wherein a projection of the light emitting layer on the substrate covers a projection of the ring-shaped insulation walls on the substrate, and the light emitting layer is located on a side of the ring-shaped insulation walls away from the substrate, i.e., being formed after forming the ring-shaped insulation walls;

wherein in a direction outwards from a center of the through hole, at least one side of at least one of the plurality of ring-shaped insulation walls has an undercut, such that the light emitting layer is discontinuous at the undercut, and opposite sides of any two adjacent ones of the plurality of ring-shaped insulation walls do not both have an undercut.

The display panel of the present disclosure comprises a through hole penetrating the display panel, a non-display area surrounding the through hole, and a display area surrounding the non-display area, wherein the display panel further comprises a water and oxygen insulation structure. The water and oxygen insulation structure is located in the non-display area (also referred to as an insulation area) surrounding the through hole, and comprises a substrate in the display panel, a plurality of ring-shaped insulation walls arranged apart from each other on the substrate, and a light emitting layer formed after forming the ring-shaped insulation walls. The structures in the insulation area do not participate in display, and thus do not belong to the display panel of the display panel. In the present disclosure, typically, the non-display area specifically refers to the insulation area around the through hole, and the outermost non-display area of the display panel may be referred to as a frame area.

The term "substrate" is a generic term for a basis on the surface of which the ring-shaped insulation walls of the present disclosure are formed. In the present disclosure, for convenience and clarity, the direction towards the substrate is called "downward" or a "bottom" direction, and the direction towards the ring-shaped insulation wall is called "upwards" or a "top" direction. It should be understood that "upward" and "downward" are relative directions.

The substrate may comprise a base substrate of a display panel, such as a flexible base substrate or a rigid base substrate, for example, a resin substrate or a glass substrate, and suitable film layers on the base substrate. These film layers may, for example a buffer layer, an interlayer dielectric layer, and the like, extend from the display area to the insulation area. Nevertheless, according to specific situations, it is also possible that the film layers of the display area do not extend to the substrate in the insulation area.

A plurality of ring-shaped insulation walls are provided on the substrate. In the present disclosure, the term "ring shape" means a general ring shape, i.e., any topologically closed ring shape. The shape of the ring shape may be described by means of the orthographic projection of the ring-shaped insulation wall on the substrate. For example, it may be circle, rectangle, square, ellipse, or the like. Because the through hole for a camera is typically circular, the ring-shaped insulation wall is typically a circular ring-shaped insulation wall accordingly.

The plurality of ring-shaped insulation walls are arranged apart outside the through hole from inside out, and each of the ring-shaped insulation walls are surrounding the through hole. In other words, the plurality of ring-shaped insulation walls are arranged one outside another in sequence.

The number of the ring-shaped insulation walls is not particularly limited, but is more than one, and should be as many as possible. If there is only one ring-shaped insulation wall, then the problem of generation of bubbles when applying adhesive between adjacent ring-shaped insulation walls will not be encountered, and thus it is not necessary to provide an undercut in the following way of the present disclosure. However, typically, the insulation structure with only one ring-shaped insulation wall is not sufficient for insulating water and oxygen. In the present disclosure, the number of the ring-shaped insulation walls may be adjusted as appropriate. Too few insulation walls have poor insulation effect. The ring-shaped insulation walls may be provided in the insulation area as many as possible. Nevertheless, in the case that the water and oxygen insulation property may be ensured, it is not necessary to increase the area of the insulation area only in order to provide the insulation walls, because this will reduce the area of display.

Since the light emitting layer is formed after formation of the ring-shaped insulation walls, the morphology of the light emitting layer will be affected by the morphology of the insulation walls. The light emitting layer is typically formed by a deposition process, and will be formed on the top surfaces of the ring-shaped insulation walls and of the substrate exposed between the ring-shaped insulation walls. The light emitting layer will be formed on the entire surface in the display area and the non-display area. Typically, the light emitting layer is an organic light emitting layer. The solution of the present disclosure is particularly suitable for an organic light emitting layer, because the problem of water and oxygen intrusion caused by continuous organic light emitting layer is significant. It should be noted that although the light emitting layer has no light emitting function in the non-display area, the light emitting layer still remains in the non-display area, because high cost and a complex process (for example, it requires additionally providing a mask having very fine edges) are needed to realize a design where the light emitting layer is accurately formed only in the display area and no light emitting layer is formed in the non-display area at all. In the present disclosure, since the problem of water and oxygen intrusion caused by continuous light emitting layer may be effectively avoided, the formation of the light emitting layer in the entire non-display area will not have an adverse effect. As such, when fabricating the light emitting layer, it is not necessary to add any special process in the through hole area and the surrounding non-display area, and thus it saves the cost significantly.

Other film layers such as an encapsulation layer of the display panel may also be formed on the light emitting layer. This is not particularly limited in the present disclosure, and will not be iterated here.

One characteristic of the present disclosure lies in that in a direction outwards from a center of the through hole, at least one side of at least one of the plurality of ring-shaped insulation walls has an undercut, such that the light emitting layer is discontinuous at the undercut.

In the present disclosure, the term "undercut" refers to a shape formed on the side wall of a ring-shaped insulation wall with a protruding top portion, as described above and as shown in FIGS. 3(a)-3(b). It should be noted that the undercut may be always depressed inwards from the top portion to the bottom portion, or first depressed inwards but slightly protruding at the bottom portion, because this will not affect the interruption of the light emitting layer formed thereafter by the undercut.

In the present disclosure, a direction outwards from the center of the through hole is intended to refer to a direction from the through hole to the display area through the non-display area. Most typically, the through hole is circular, and thus the direction is the radial direction of the through hole. Hereinafter, the present disclosure will be essentially described in the case of using a circular hole. Accordingly, the above direction is the radial direction. In some special cases, a non-circular hole, such as an ellipse hole and a square hole, may also be used, and thus the direction is a direction from the center of the hole towards the display area.

For example, in the present disclosure, in the radial direction of the circular through hole, it is necessary to form an undercut on at least one side wall of at least one ring-shaped insulation wall, such that the light emitting layer is discontinuous there. If none of the ring-shaped insulation walls has an undercut in the above direction, then the light emitting layer may also be formed on the side walls of the insulation walls, so that the light emitting layer may continuously cross over the insulation walls in the radial direction, thereby forming a water and oxygen intrusion passage. Of course, both the inner side and the outer side of one ring-shaped insulation wall may have an undercut. Further, two or more of ring-shaped insulation walls may have an undercut, or even all the ring-shaped insulation walls have an undercut.

Another characteristic of the present disclosure lies in that in a direction outwards from a center of the through hole, opposite sides of any two adjacent ones of the plurality of ring-shaped insulation walls do not both have an undercut. As described above, the inventors of the present disclosure have found that when opposite sides of adjacent ring-shaped insulation walls both have an undercut, the uniformity of the adhesive coating will be affected by the defects such as bubbles generated in subsequent application of the planarization adhesive film layer, thereby generating hole halo in the display area. This will significantly affect the appearance of the product, and generally affect the planarization of film layers of the display area around the through hole in the film coating process (such as applying the photoresist). The inventors of the present disclosure have also surprisingly found that if one of the opposite sides of adjacent ring-shaped insulation walls has an undercut and the other does not have an undercut, the bubbles may escape sufficiently, avoiding non-uniform adhesive coating. This excellently solves the problem of hole halo, greatly improves the appearance of the product, and has no adverse effect on the film coating process. In other words, the water and oxygen insulation structure of the present disclosure is not only beneficial for solving the problem of hole halo, but also beneficial for eliminating the film layer defects in the display area around the through hole in any subsequent film coating process.

Therefore, in the present disclosure, by using ring-shaped insulation walls having a particular undercut structure, the intrusion of water and oxygen via the light emitting layer is prevented, while no problem of non-uniformity or hole halo will be caused.

Without departing from the above principle, the undercut of the ring-shaped insulation wall may be designed as needed. In an embodiment, each ring-shaped insulation wall has an inner side with an undercut and an outer side without an undercut, or each ring-shaped insulation wall has an outer side with an undercut and an inner side without an undercut. In other words, each ring-shaped insulation wall has an undercut on one side and has no undercut on the other side, and all undercuts are on the same sides. As such, it may be ensured that opposite sides of any two adjacent ring-shaped insulation walls do not both have an undercut. In an embodiment, the plurality of ring-shaped insulation walls are alternately an insulation wall with undercuts on both inner side and outer side and an insulation wall without undercut on either inner side or outer side. As such, the undercut conditions of two adjacent ring-shaped insulation walls on both sides of each ring-shaped insulation wall are different from that ring-shaped insulation wall, which also ensure that opposite sides of any two adjacent ring-shaped insulation walls do not both have an undercut.

The above two embodiments are convenient to design and practice. Of course, other designs may also be employed as needed.

It is very beneficial to use the electrode material in the display panel to form the insulation wall. During the manufacture of the display panel, an electrode layer is formed by a patterning process before forming the light emitting layer. Because the electrode material such as a metal material itself may insulate water and oxygen, the insulation wall formed from the electrode material may be obtained simply by appropriately patterning around the through hole while patterning the electrode. In an embodiment, the display panel further comprises an array of thin film transistors in the display area, and the ring-shaped insulation walls are formed in the same layer, i.e., disposed in the same layer and of the same material, as a source/drain electrode of the thin film transistor in the display area. Such a manufacture process is a simple process, and does not need to add equipment investment under existing processing conditions. In particular, when the source/drain electrode has a multiple layer structure (for example, a three-layer structure of Ti—Al—Ti), it is easier to form an inverse step-shaped undercut by a subtractive manufacture process, such as etching, by means of the difference in physical and chemical properties between various layers.

In an embodiment, the undercut is a step-shaped undercut. The step-shaped undercut has a horizontal surface, and is good at interrupting the light emitting layer. The step-shaped undercut may also be easily achieved through a multiple layer structure. In an embodiment, the ring-shaped insulation walls comprise a second sub-layer and a first sub-layer on the second sub-layer, and an orthographic projection of the second sub-layer on the substrate is within an orthographic projection of the first sub-layer on the substrate. The first sub-layer above and the second sub-layer below form a step-shaped undercut. The second sub-layer and the first sub-layer may be formed in sequence by an additive manufacture process, and the second sub-layer depressed inwards relative to the first sub-layer may be formed by a subtractive manufacture process by means of the difference in physical or chemical properties between those two sub-layers. Further, there may be a third sub-layer or more sub-layers below the second sub-layer. As described above, the third sub-layer may also protrude outwards with respect to the second sub-layer. In an embodiment, the second sub-layer may be an aluminum layer, and the first sub-layer is a titanium layer. Further, there may also be a titanium layer as the third sub-layer. Such a multiple layer structure is consistent with the metal electrode structure of a source/drain electrode common in the display panel, and thus may be formed in the same layer as the source/drain electrode.

In an embodiment, the undercut may have a lateral step (i.e., a distance between the most protruding portion and the most depressed portion) in a range from about 0.2 µm to 0.8 µm. If the step is too large, the structure may be not robust sufficiently, and the problem of non-uniform adhesive coating may still be caused although there is an undercut on only one side of adjacent insulation walls. If the step is too small, continuous light emitting layer may still be formed.

In an embodiment, the plurality of ring-shaped insulation walls are a plurality of concentric circular ring-shaped insulation walls. The concentric circular ring-shaped insulation walls are easy to design and manufacture, and meet the requirements for arranging a camera in a full screen display. Further, the circular ring-shaped insulation walls have no acute angle, which is beneficial for the uniformity and stability of the structure.

In an embodiment, the ring-shaped insulation walls have a height in a range from about 0.3 µm to 0.7 µm. If the height is too small, continuous light emitting layer may still be formed. If the height is too large, too much space may be occupied, and it is difficult to form other subsequent film layers.

In an embodiment, a distance between adjacent ring-shaped insulation walls is in a range from about 3 µm to 7 µm. If the distance is too small, continuous light emitting layer may still be formed. If the distance is too large, the number of the ring-shaped insulation walls may not be sufficient, or the non-display area occupies too much space.

The display panel of the present disclosure has no hole halo around the through hole, and has a good appearance.

In an embodiment, the present disclosure also provides a method for manufacturing the display panel according to the present disclosure, comprising steps of:

forming the plurality of ring-shaped insulation walls on the substrate;

forming a planarization adhesive film layer in the display area and the non-display area after forming the plurality of ring-shaped insulation walls;

removing the planarization adhesive film layer in the non-display area; and forming the light emitting layer after removing the planarization adhesive film layer in the non-display area.

First, the ring-shaped insulation walls having the characteristics of the present disclosure are formed on the substrate.

The planarization adhesive film layer is formed in the display area and the non-display area after forming the ring-shaped insulation walls having a particular undercut design of the present disclosure. The planarization adhesive film layer may be formed by an extrusion coating process. This process comprises applying a molten material for the planarization adhesive film layer in a semi-fluid state through an extrusion slit moving in single direction. In the case of the water and oxygen insulation structure of the present disclosure, the material for the planarization adhesive film layer may sufficiently fill the gap between the ring-shaped insulation walls, and a continuous and planar adhesive film may be formed. In contrast, in the case where the opposite sides of the adjacent ring-shaped insulation walls both have an undercut, this adhesive coating process will cause the problem of discontinuous planarization adhesive film layer material due to the aforementioned bubble issue or the like, which in turn cause the hole halo in the display area.

In the case of the water and oxygen insulation structure of the present disclosure, the effect of the planarization adhesive film coating is not affected by the relationship between the direction of applying the adhesive film and the directions of the ring-shaped insulation wall and the undercut. Therefore, for example, in the case of the circular ring-shaped insulation walls, the adhesive film may be formed in any applying direction.

Then, the planarization adhesive film layer in the non-display area is removed. The adhesive film in the non-display area may be removed by a development process. The finally obtained adhesive film layer of the display area has a clear edge, has no hole halo, and has a good appearance.

Then, the light emitting layer is formed. The light emitting layer formed at the portion of the ring-shaped insulation wall having an undercut will be discontinued at the undercut.

In an embodiment, the planarization adhesive film layer is a polyimide layer.

In an embodiment, the step of forming the plurality of ring-shaped insulation walls comprises forming the plurality of ring-shaped insulation walls in the same layer as a source/drain electrode of a thin film transistor of the display screen. As described above, such a manufacture process has a simple process, and does not need to add equipment investment. In particular, when the source/drain electrode has a multiple layer structure (for example, a three-layer structure of Ti—Al—Ti), it is easier to form a step-shaped undercut by a subtractive manufacture process, such as etching, by means of the difference in physical and chemical properties between various layers.

In an embodiment, the step of forming the plurality of ring-shaped insulation walls comprises forming the undercut selectively. Specifically, an insulation wall with vertical side walls is firstly formed. Subsequently, the side wall of the insulation wall on which an undercut is not desired to be formed is protected with, for example, a photoresist, while the side wall of the insulation wall on which an undercut is desired to be formed is exposed, and etched, such that an undercut may be formed at a desired position.

The embodiments of the present disclosure will be further described below with reference to the drawings.

Figure 6:
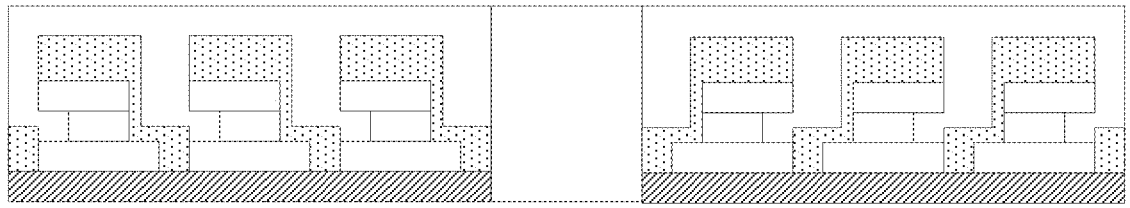
FIGS. 6(a)-6(b) show schematic sectional views of two embodiments of the present disclosure.
Figure 6:
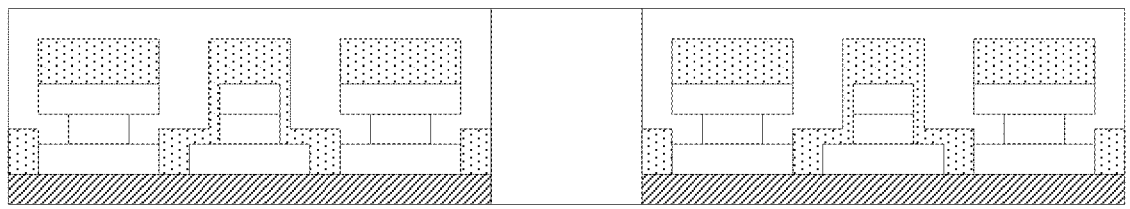

FIG. 6(a) shows a schematic sectional view of an embodiment of the present disclosure. Here, all undercuts are on the outer sides of the ring-shaped insulation walls. FIG. 6(b) shows a schematic sectional view of another embodiment of the present disclosure. Here, the ring-shaped insulation walls are alternately an insulation wall with undercuts on both inner side and outer side and an insulation wall without undercut on either inner side or outer side. All these embodiments meet the principle of the present disclosure. Therefore, the intrusion of water and oxygen via the light emitting layer may be prevented, while no problem of non-uniformity or hole halo will be caused. As may be seen, due to the presence of the undercuts, the light emitting layer is discontinuous. Meanwhile, because one of the opposite sides of adjacent ring-shaped insulation walls has an undercut while the other does not have an undercut, problems such as bubbles and broken adhesive film will not occur during the fabrication of the planarization adhesive film layer of the display panel, ensuring the uniformity of the adhesive film in the display area around the through hole.

Figure 7:
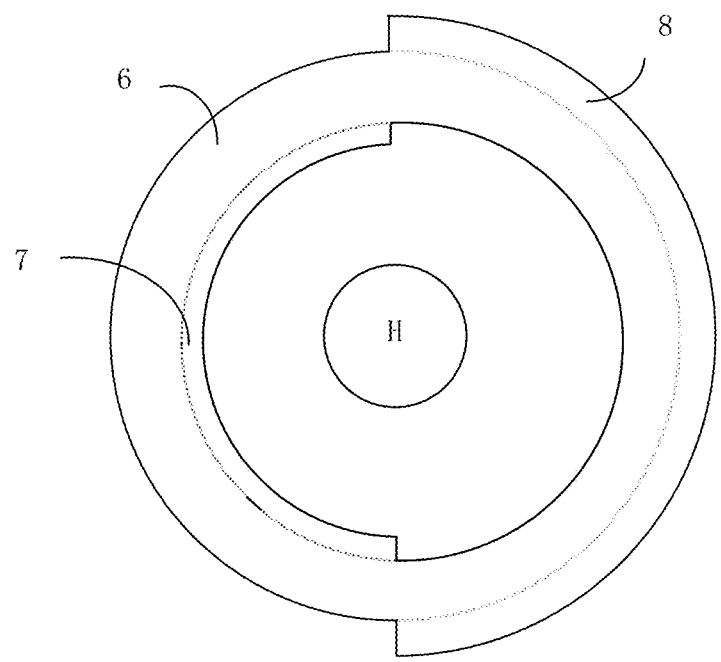
FIG. 7 shows a top view of a ring-shaped insulation wall according to another embodiment of the present disclosure.

FIG. 7 shows a top view of a ring-shaped insulation wall according to another embodiment of the present disclosure. The left semi-circle of the insulation wall 6 has an undercut 7 protruding towards the through hole in a radial direction, and the right semi-circle has an undercut 8 protruding towards the display area in the radial direction. A plurality of ring-shaped insulation walls having such a shape may be arranged one outside another to form the water and oxygen insulation structure of the present disclosure. Such an embodiment also meets the structure requirement for the present disclosure, i.e., that one of the opposite sides of adjacent ring-shaped insulation walls has an undercut while the other does not have an undercut. It should be noted that in the design of FIG. 7, there is still a passage of continuous light emitting layer sequentially through the inner side of the right semi-circle having no undercut, the circular ring on the top surface of the ring-shaped insulation wall, and the outer side of the left semi-circle having no undercut from inside to outside. Nevertheless, because the path length of this passage is much longer than that of the passage directly connected along the radial direction, and the number of the ring-shaped insulation walls is large, the water and oxygen insulation property may be ensured.

The embodiments of the present disclosure will be further described below with reference to the Examples and Comparative Example.

Example 1

A display panel having a through hole was manufactured by the following process.

During the fabrication of a TFT base substrate, 4 concentric circular ring-shaped insulation walls were formed in a non-display area while the source/drain electrode of the TFT having a three metal layer structure of Ti—Al—Ti was formed in a display area, and the circular ring-shaped insulation walls having a radial thickness of about 5 µm and a distance between adjacent insulation walls of about 7 µm. The outermost ring-shaped insulation wall had a diameter of about 3.5 mm. The undercuts of these insulation walls were arranged in the manner as show in FIG. 7. The ring-shaped insulation wall had a height of about 0.7 µm, and the undercut had a lateral step of about 0.8 µm. Specifically, ring-shaped walls having substantially vertical sides were formed in the non-display area by dry etching, and then the undercuts of the insulation walls were formed through a patterned photoresist protective layer by wet etching while forming the source/drain electrode, wherein the side walls on which no undercut would be formed were protected from being etched by the photoresist protective layer.

Then, polyimide was applied on the entire display panel by an extrusion coating process. After being cured, a planarization adhesive film layer was formed.

Then, the planarization adhesive film layer in the non-display area around the through hole was removed by a development process.

After forming components such as a pixel anode and a pixel definition layer in the display area, the formation of a light emitting layer began. Here, an organic light emitting layer was formed through an open mask by an evaporation process, outside the frame area of the display panel, and in all of the display area, the non-display area around the through hole and the position for the through hole.

Then, subsequent film layers were fabricated. Subsequent film layers comprise, for example, a pixel cathode and the like.

Finally, a through hole was formed in the interior of the insulation walls in the non-display area. The through hole was surrounded and protected by the insulation walls.

In Example 1, the fabrication processes other than controlling the geometry and number of the ring-shaped insulation walls by etching all employed conventional technical means in related art.

Figure 8A:
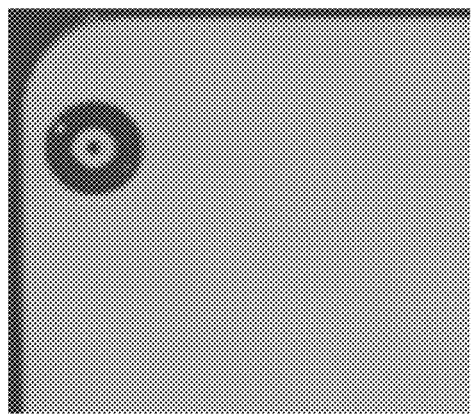
FIGS. 8(a)-8(b) show photographs of the through holes fabricated in the Examples and Comparative Example of the present disclosure.

FIG. 8(a) shows the photograph of the through hole fabricated in Example 1. As may be seen, there was no hole halo.

Example 2

A display panel was manufactured by the same process as in Example 1, except that 15 concentric circular ring-shaped insulation walls were formed and a distance between adjacent insulation walls was about 3 μm. The ring-shaped insulation wall had a height of about 0.3 μm, and the undercut had a lateral step of about 0.2 μm.

There was no hole halo defect at the periphery of the through hole fabricated in Example 2, either.

COMPARATIVE EXAMPLE

A display panel was manufactured by the same process as in Example 1, except that the undercut of the ring-shaped insulation wall was as shown in FIG. 4. The undercut was formed by directly wet etching without protecting the side walls of the insulation wall.

Figure 8B:
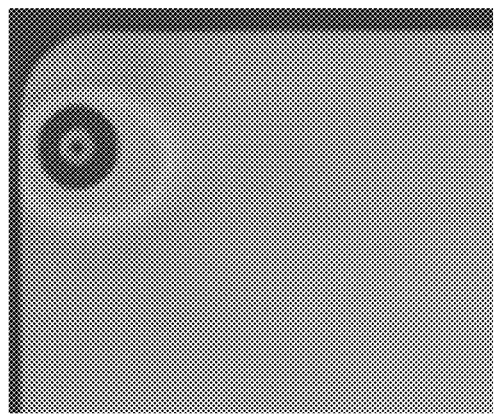

There was a hole halo defect at the periphery of the through hole fabricated in the Comparative Example, as shown in FIG. 8(b).

The water and oxygen insulation structure for a through hole in a display panel according to the present disclosure has a simple manufacture process and does not need adding equipment investment. Also, the intrusion of water and oxygen via the light emitting layer may be prevented, while no problem of non-uniformity or hole halo will be caused.

The wording "about" in the present disclosure means that a value within an error range for the process and measurement is allowed, and the boundary of the value is not strictly limited.

Obviously, modifications and variations on the embodiments of the present disclosure may be made by those skilled in the art without departing from the spirit and scope of the present application. As such, if these modifications and variations fall within the scopes of the claims of the present application or equivalents thereof, the present application is intended to encompass these modifications and variations.

What is claimed is:

1. A display panel comprising a through hole penetrating the display panel, a non-display area surrounding the through hole, and a display area surrounding the non-display area, wherein the display panel further comprises a water and oxygen insulation structure located in the non-display area and comprising:
   a substrate;
   a plurality of ring-shaped insulation walls on the substrate, wherein the plurality of ring-shaped insulation walls are arranged apart outside the through hole from inside out, and each of the ring-shaped insulation walls is surrounding the through hole; and
   a light emitting layer, wherein a projection of the light emitting layer on the substrate covers a projection of each of the plurality of ring-shaped insulation walls on the substrate, and the light emitting layer is located on a side of the ring-shaped insulation walls away from the substrate;
   wherein in a direction outwards from a center of the through hole, at least one side of at least one of the plurality of ring-shaped insulation walls has an undercut, such that the light emitting layer is discontinuous at the undercut, and opposite sides of any two adjacent ones of the plurality of ring-shaped insulation walls do not both have an undercut, wherein that the light emitting layer is discontinuous at the undercut means that a portion of the light emitting layer where the light emitting layer has a project covers a projection of the at least one ring-shaped insulation wall having an undercut and a portion of the light emitting layer where the light emitting layer has a project covers a projection of the ring-shaped insulation wall adjacent to the at least one ring-shaped insulation wall having an undercut at a side having the undercut are not continuous.

2. The display panel according to claim 1, wherein each of the ring-shaped insulation walls has an inner side with an undercut and an outer side without an undercut, or each of the ring-shaped insulation walls has an outer side with an undercut and an inner side without an undercut.

3. The display panel according to claim 1, wherein the plurality of ring-shaped insulation walls are alternately an insulation wall with undercuts on both inner side and outer side and an insulation wall without undercut on either inner side or outer side.

4. The display panel according to claim 1, wherein the display panel further comprises an array of thin film transistors in the display area, and the ring-shaped insulation walls are disposed in the same layer and have the same material as a source/drain electrode of the thin film transistor in the display area.

5. The display panel according to claim 1, wherein the undercut is a step-shaped undercut.

6. The display panel according to claim 5, wherein the ring-shaped insulation walls comprise a second sub-layer and a first sub-layer on the second sub-layer, and an orthographic projection of the second sub-layer on the substrate is within an orthographic projection of the first sub-layer on the substrate.

7. The display panel according to claim 6, wherein the second sub-layer is an aluminum layer, and the first sub-layer is a titanium layer.

8. The display panel according to claim 1, wherein the undercut has a lateral step in a range from about 0.2 μm to 0.8 μm.

9. The display panel according to claim 1, wherein the plurality of ring-shaped insulation walls are a plurality of concentric circular ring-shaped insulation walls.

10. The display panel according to claim 1, wherein the ring-shaped insulation walls have a height in a range from about 0.3 μm to 0.7 μm.

11. The display panel according to claim 1, wherein a distance between adjacent ring-shaped insulation walls is in a range from about 3 μm to 7 μm.

12. A method for manufacturing the display panel according to claim 1, comprising steps of:
   forming the plurality of ring-shaped insulation walls on the substrate;
   forming a planarization adhesive film layer in the display area and the non-display area after forming the plurality of ring-shaped insulation walls;
   removing the planarization adhesive film layer in the non-display area; and
   forming the light emitting layer after removing the planarization adhesive film layer in the non-display area.

13. The method according to claim 12, wherein the planarization adhesive film layer is a polyimide layer.

14. The method according to claim 12, wherein the step of forming the plurality of ring-shaped insulation walls comprises forming the plurality of ring-shaped insulation walls in the same layer as a source/drain electrode of a thin film transistor of the display panel.

\* \* \* \* \*